United States Patent [19]
Saito et al.

[11] Patent Number: 6,077,894
[45] Date of Patent: Jun. 20, 2000

[54] INSTRUMENT AND MOUNTING EQUIPMENT USED IN CLEAN ROOM

[75] Inventors: Misako Saito, Nakakoma-gun; Takenobu Matsuo; Tsuyoshi Wakabayashi, both of Kofu; Sadao Kobayashi, Yokohama; Yoshihide Wakayama, Chigasaki; Masayuki Imafuku, Yokohama, all of Japan

[73] Assignees: Tokyo Electron Limited; Taisei Corporation, both of Tokyo, Japan

[21] Appl. No.: 09/147,061

[22] PCT Filed: Mar. 27, 1997

[86] PCT No.: PCT/JP97/01039

§ 371 Date: Sep. 29, 1998

§ 102(e) Date: Sep. 29, 1998

[87] PCT Pub. No.: WO97/37381

PCT Pub. Date: Oct. 9, 1997

[30] Foreign Application Priority Data

| Mar. 29, 1996 | [JP] | Japan | 8-077558 |
| Mar. 29, 1996 | [JP] | Japan | 8-077559 |

[51] Int. Cl.$^7$ .................................................. C08K 5/20
[52] U.S. Cl. ................... 524/220; 524/243; 524/375; 524/488
[58] Field of Search .................... 524/488, 220, 524/243, 375

[56] References Cited

U.S. PATENT DOCUMENTS

| 3,761,965 | 10/1973 | Barasch | 2/167 |
| 3,862,877 | 1/1975 | Camden | 161/57 |
| 3,872,515 | 3/1975 | Miner | 2/168 |
| 4,105,567 | 8/1978 | Koerner | 252/8.6 |
| 4,251,581 | 2/1981 | Schoppa | 428/95 |
| 4,272,568 | 6/1981 | Berend | 427/261 |
| 4,333,982 | 6/1982 | Rand | 428/245 |
| 4,752,477 | 6/1988 | Kraft | 424/403 |
| 4,937,277 | 6/1990 | O'Lenick | 524/318 |
| 5,273,706 | 12/1993 | Laughner | 264/540 |
| 5,407,715 | 4/1995 | Buddenhagen | 428/35.7 |
| 5,414,051 | 5/1995 | Mason | 525/432 |
| 5,500,477 | 3/1996 | Reuschel | 525/398 |
| 5,539,062 | 7/1996 | Brown | 525/397 |
| 5,569,485 | 10/1996 | Dahlquist | 427/65 |
| 5,660,841 | 8/1997 | Kraft | 424/403 |
| 5,725,867 | 3/1998 | Mixon | 424/402 |
| 5,742,943 | 4/1998 | Chen | 2/168 |
| 5,846,607 | 12/1998 | Hurley | 427/374.2 |
| 5,881,386 | 3/1999 | Horwege | 2/161.7 |

*Primary Examiner*—Paul R. Michl
*Attorney, Agent, or Firm*—Oblon, Spivak, McClelland, Maier & Neustadt, P.C.

[57] ABSTRACT

There are instruments used for handling a substrate in a clean room at room temperature and atmospheric pressure, which contain a resin base and at least one additive selected from the group consisting of a lubricant, a plasticizer, an anti-oxidizing agent and an antistatic agent, and the additives do not generate gaseous organic material compound under conditions of room temperature and atmospheric pressure.

23 Claims, 3 Drawing Sheets

FIG. 4

INSTRUMENT AND MOUNTING EQUIPMENT USED IN CLEAN ROOM

TECHNICAL FIELD

The present invention relates to instruments and wearable articles, used in a clean room in the field of manufacturing semiconductor devices, and more specifically to a wafer carrier (cassette), a standard mechanical interface POD (to be abbreviated as SMIF POD hereinafter), a wafer box, a wafer basket, and wafer handling jigs, which are used for handling semiconductor wafers in a clean room, and clean room shoes which are worn by an operator in a clean room.

BACKGROUND ART

Recently, as the degree of integration of semiconductor device increases, the width of a line of its circuit pattern is presently in a deep sub-micron. In the case where a circuit pattern of a line width of a deep sub-micron, the internal atmosphere of the clean room must be controlled to a cleanness of a high level. Under these circumstances, the problem of organic materials adsorbed to the surface of a wafer is recently focused, in addition to the conventional problem that particle-like dust adheres to the surface of a wafer (for example, "Gaseous Contaminants and Present Situation of Counter-measures Taken to Eliminate It" by Fujii, Air Cleaning Vol. 32, No. 3, P43 (1994), Japan Society of Air Cleaning).

The inventors of the present invention conducted intensive studies on any factors which could give rise to a source of organic material in a clean room. The result indicated that aliphatic hydrocarbons, organic carboxylic acid esters, phenols, oxides of these materials and amines are generated in very small amount, from resin-made instruments such as wafer carriers and SMIF POD.

Further, according to other studies carried out by the same inventors, it was found that organic carboxylic acid esters, phenols and oxides of these materials are generated in very small amount from the sole (made of resin) of a conventional clean room shoe, as a so-called out-gas.

These organic materials are adsorbed to the surfaces of wafers eventually via air streams in the clean room, causing a variety of bad effects in the formation of a circuit pattern. For example, in the case where a gate oxide film is formed on the surface of a wafer while some organic materials are adsorbed on the surface of the wafer, the start of the growth of the film is delayed, the sheet resistance value of the film is decreased, and the surface of the film becomes rough in projections and recesses.

DISCLOSURE OF INVENTION

The object of the present invention is to provide instruments and wearable articles, which can suppress the generation of organic materials as much as possible, when they are used in a clean room.

Figure 1A:
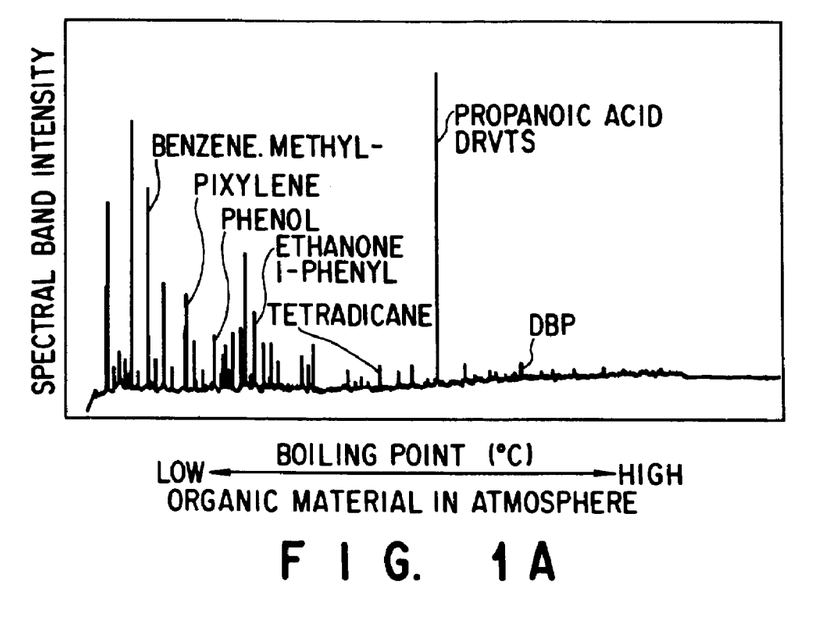
FIG. 1A is a diagram showing a characteristic curve which indicates the measurement result of the organic materials contained in the atmosphere for processing semiconductor wafers (that is, clean room)
Figure 1B:
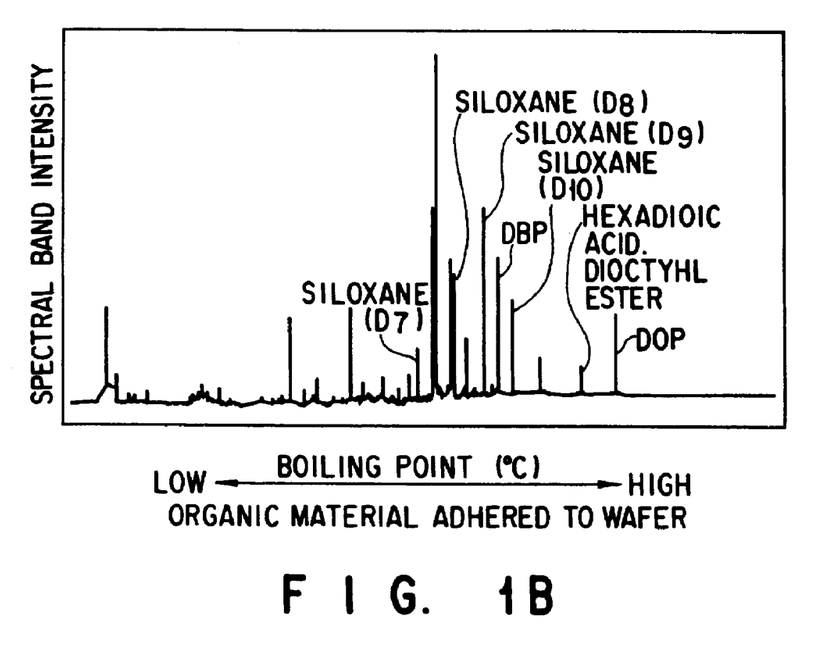
FIG. 1B is a diagram showing a characteristic curve which indicates the measurement result of the organic materials adhered to the surface of a semiconductor wafer.

The inventors of the present invention examined organic materials in the atmosphere in the step of manufacturing a semiconductor device, and obtained the results shown in FIG. 1A. Further, they examined organic materials adhered to a semiconductor wafer during the step of manufacturing a semiconductor device, and obtained the results shown in FIG. 1B. When these results were taken as a whole, it was found that the detected organic materials were contained in the ordinary additives (lubricant, plasticizer, antioxidizing agent, antistatic agent) added to resin materials which constitute the instruments for handling substrates, such as wafer cassettes and SMIF POD.

The organic materials generated from these instruments are components contained in the lubricant, plasticizer, anti-oxidizing agent, antistatic agent, etc. which are added to the resin base. They are made of relatively light molecules, and consequently they easily evaporate from the resin base during the use, as an out gas. Specifically, the aliphatic hydrocarbons are generated from the lubricant added to enhance the moldability, the organic carboxylic acid esters are generated from the plasticizer added to maintain the material properties, the phenols and oxides thereof are generated from the anti-oxidizing agent added to prevent the deterioration due to oxidization, which would occur during or after the molding process, and the amines are generated from the antistatic agent added to prevent static charge.

Further, the organic materials generated from the sole of the shoes are components contained in the plasticizer, anti-oxidizing agent, antistatic agent and ultraviolet ray absorbing agent, which are added to the resin base. They are made of relatively light molecules, and consequently they easily evaporate from the resin base during the use, as an out gas.

In consideration of the above findings, the inventors of the present invention have completed the present invention, and with use of additives (lubricant, plasticizer, anti-oxidizing agent and antistatic agent) containing organic materials having boiling points higher than those organic materials (for example, a higher boiling point than that of DOP (dioctyl phthalate), that is, organic materials having low volatility values, the amount of organic material adsorbed onto a substrate can be significantly reduced. It should be noted that the judgment as to whether or not organic materials volatilize from a substrate handling instrument and are adsorbed on the surface of a substrate can be made by means of a wafer analyzer or the like, which will be explained later.

In the present invention, a "substrate" is meant to be an object of the manufacture of semiconductor devices, such as a silicon wafer, glass substrate or mask. Further, examples of the instrument for handling substrates are a wafer box, SMIF POD, a wafer tray, a wafer cassette, a wafer basket, a wafer handling jig, etc. . These wafer handling instruments are discussed in, for example, Jap. Pat. Appln. KOKAI Publication No. 1-222429 and U.S. Pat. No. 4,534,389.

The inventors of the present invention examined organic materials in the atmosphere in the step of manufacturing a semiconductor device, and obtained the results shown in FIG. 1A. Further, they examined organic materials adhered to a semiconductor wafer during the step of manufacturing a semiconductor device, and obtained the results shown in FIG. 1B. When these results were taken as a whole, it was found that the detected organic materials match well the ordinary additives (lubricant, plasticizer, anti-oxidizing agent, antistatic agent) contained in the resin materials which constitute the instruments for handling substrates, such as wafer cassettes and SMIF POD.

In consideration of the above findings, the inventors of the present invention have completed the present invention, and with use of additives (lubricant, plasticizer, anti-oxidizing agent and antistatic agent) containing organic materials having boiling points higher than those organic materials (for example, a higher boiling point than that of DOP (dioctyl phthalate), that is, organic materials having low volatility values, the amount of organic material adsorbed onto a substrate can be significantly reduced. It should be noted that the judgment as to whether or not organic materials volatilize from a substrate handling instrument and are adsorbed on the surface of a substrate can be made by means of a wafer analyzer or the like, which will be explained later.

An instrument of the present invention, used in the clean room is an instrument used for handling a substrate in a clean room at room temperature and under atmospheric pressure, and it is characterized by including a resin base and at least one additive selected from the group consisting of a lubricant, a plasticizer, an anti-oxidizing agent and an antistatic agent, and that the additives does not generate a gaseous organic component at room temperature and under atmospheric pressure.

The wearable articles of the present invention include shoes (of the type whose soles are covered by cloth), groves, clothes (suits), glasses and the like, which are worn by the operator in a clean room during the manufacture of semiconductor devices. To the resin portion of the wearable articles, the plasticizer for enhancing the moldability and maintaining the material properties, the anti-oxidizing agent for preventing the deterioration due to oxidization, which would occur during or after the molding process, and the antistatic agent for imparting an anti-static property, and if necessary, an ultraviolet ray absorbing agent, etc. are added as additives.

The inventors of the present invention examined the organic components adhered to wafers during the manufacture of semiconductor devices, and it was found that they are components of the additives (plasticizer, anti-oxidizing agent, antistatic agent and ultraviolet ray absorbing agent) contained in the resin material which constitutes the sole of the shoe for clean room.

In consideration of the above findings, the inventors of the present invention have completed the present invention, and with use of additives (plasticizer, anti-oxidizing agent, antistatic agent and ultraviolet ray preventing agent) containing organic materials having boiling points higher than those organic materials (for example, a higher boiling point than that of 2,6-di-t-butyl-p-cresol), that is, organic materials having low volatility values (less generation of an out gas), the amount of organic material adsorbed onto a substrate can be significantly reduced. It should be noted that the judgment as to whether or not organic materials volatilize from the clean room shoe and are adsorbed on the surface of a substrate can be made by means of a wafer analyzer or the like, which will be explained later.

A wearable article of the present invention, used in the clean room is an article worn by the operator in a clean room at room temperature and under atmospheric pressure, and it is characterized by including a resin base and at least one additive selected from the group consisting of, a plasticizer, an anti-oxidizing agent, an antistatic agent and ultraviolet ray preventing agent, and that the additives does not generate a gaseous organic component at room temperature and under atmospheric pressure.

BEST MODE OF CARRYING OUT THE INVENTION

Various preferable modes of the present invention will now be specifically described.

Figure 2A:
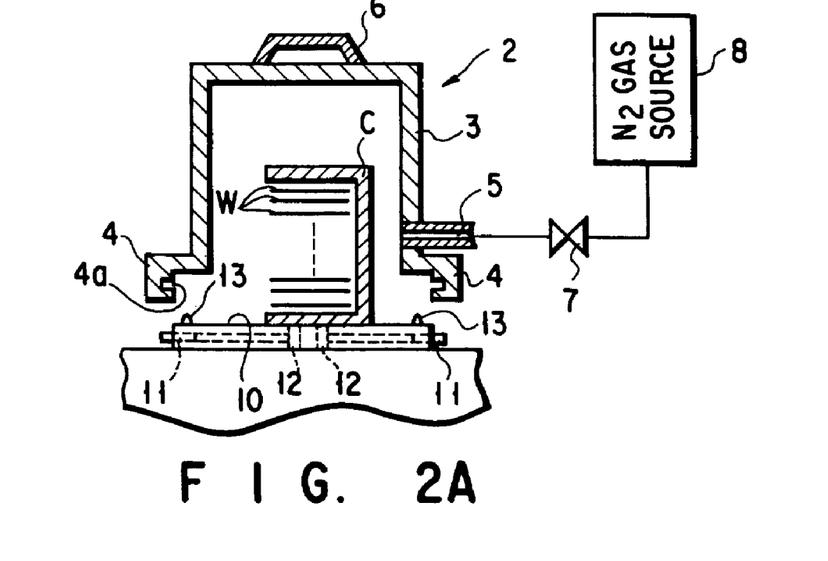
FIG. 2A is a lateral cross sectional view showing a SMIF POD (Standard Mechanical Interface POD) used for isolating a wafer carrier (cassette) from outside atmosphere.

First, while referring to FIGS. 2A and 2B, a SMIF POD (Standard Mechanical Interface POD) will now be described.

Jap. Pat. Appln. KOKAI Publication No. 1-222429 and U.S. Pat. No. 4,534,389 each discloses a portable SMIF POD 2 used for isolating a wafer W and a carrier (cassette) C from outside atmosphere. As can be seen in FIG. 2A, the SMIF POD 2 includes a box-shaped cover 3 and a disk-shaped bottom portion 10. The SMIF POD cover 3 is an integral molded form of a transparent or semitransparent resin, which has a volume sufficient to contain one wafer cassette C, and at the uppermost portion thereof, a handle 6 is provided.

In a lower section of the SMIF POD cover 3, a flange portion 4 is formed. Further, a ring-like recess section 4a is made in an inner side of the flange portion 4. The bottom portion 10 of the SMIF POD has a plurality of pins 11. Each of the pins 11 is connected to a link mechanism 12. For example, if a member such as a projection 28 is plugged into a hole 12a of the link mechanism 12 and rotated, each pin 11 projects from the outer periphery portion of the bottom portion 10 or contract within the outer peripheral portion. That is, when the SMIF POD cover 3 is placed on the bottom portion 10 and the pins 11 are projected, the pins 11 are engaged to the recess section 4a, and thus the cover 3 and the bottom portion 10 are integrally jointed together.

Further, a flexible hose 5 is provided for the side wall of the cover 3. The flexible hose 5 is connected to a nitrogen gas supply source 8 via a valve 7, and nitrogen gas is introduced to the SMIF POD 2. It should be noted that the flexible hose 5 is made of a soft resin.

Figure 2B:
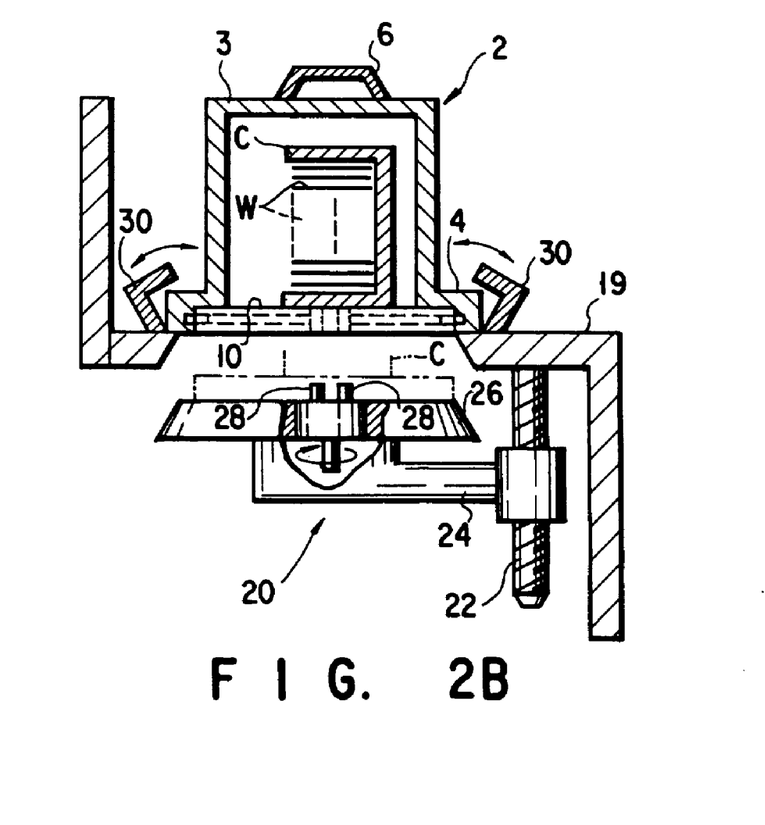
FIG. 2B is a lateral cross sectional view showing the SMIF POD, designed to illustrate the state of the SMIF POD in use.

As shown in FIG. 2B, a cassette transfer mechanism 20 is provided underneath a table 19. The cassette transfer mechanism 20 includes a vertical ball screw mechanism 22, a support arm 24, a support table 26 and a projecting member 28. The support table 26 is made ascendable/discendable by the vertical ball screw mechanism 22. The projecting member 28 has a pair of projecting portions 28a projecting upwards from the support table 26, and is supported rotatable around the verti cal central axis.

An opening 19a is made in the table 19. A plurality of chuck members 30 are provided in the vicinity of the opening 19a.

As the SMIF POD 2 is placed on the table 19, the chuck members 30 hold the flange section 4, and thus the SMIF POD 2 is fixed onto the table 19. Subsequently, when the support table 26 is moved up, the projecting portions 28a of the projecting member 28 are plugged into the hole 12a of the link mechanism 12 via the opening 19a. Further, as the projecting member 28 is rotated, the pins 11 come off from the recess section 4a, and the engagement between the bottom portion 10 and the cover 3 is released. When the support table 26 is moved down, only the cover 3 is left on the table 19, and the cassette C and the bottom portion 10 move down together with the support table 26.

Next, the materials of the structural components of the SMIF POD 2 and the cassette C will now be described.

Each of the structural components of the SMIF POD 2 and the cassette C is made of a hard resin by injection molding. In particular, the cassette C and the cover 3 of the SMIF POD are respectively integral molded forms of a hard resin, which are made by the injection molding. It should be noted that the pins 11, the link mechanism 12, the projecting member 28, the chuck members 30 and the like may be made of metals. The flexible hose 5 is made of a composite material obtained by reinforcing a hard resin with metal fibers.

The components of the additives added to resin substrates will now be described.

In the present invention, it is preferable that the lubricant should contain as a main component, at least one aliphatic hydrocarbon having a carbon atom number of 20 or more, and higher alcohol having a carbon atom number of 18 or more, and the lubricant should not contain aliphatic hydrocarbons having a carbon atom number of less than 20, or higher alcohols having a carbon atom number of less than 18. It is particularly preferable that the lubricant should contain as the main component at least one of paraffins/waxes such as micro-crystalline wax, natural paraffin, synthetic paraffin and polyolefin wax; and higher alcohols such as synthetic ramificated higher alcohols having a carbon atom number of 18, 20 and 24 and natural oleyl alcohols. If the main component of the lubricant is a limphatic hydrocarbon having a carbon atom number of 19 or less, it volatilizes from the substrate handling instrument at a normal temperature of a clean room (room temperature of 23° C.), and is adsorbed on a substrate, thus contaminating the surface of the substrate. Therefore, it is not preferable.

In the present invention, it is preferable that the main component of the plasticizer should be one of carboxylic acid ester having a molecular weight of 413 or higher, a polyester having a molecular weight of 400 or higher and an epoxy-based compound having a molecular weight of 400 or higher. Further, it is particularly preferable that the main component of the plasticizer should be at least one of phthalic ester-based compounds such as di-isodecyl phthalate (molecular weight: 447) and dilauryl phthalate (molecular weight: 502); aliphatic dibasic acid ester-based compounds such as di-2-ethylhexyl azelate (molecular weight: 413) and di-2-ethylhexyl sebacate (molecular weight: 427); trimellitate ester-based compounds such as tris-2-ethylhexyl trimellitate (molecular weight: 547) and trioctyl trimellitate (molecular weight: 547); polyester-based compounds which are polymers obtained by reactions between dibasic acids such as adipic acid, azelaic acid, sebacic acid and phthalic acid, and glycol or glycerin, especially, propylene glycol adipate-based compounds or butylene glycol adipate-based compounds each having a molecular weight of 2000 to 8000; and epoxy-based compounds such as epoxy fatty ester-based compounds (molecular weight: 400 to 500) and epoxy oil (molecular weight: about 1000).

It should be noted that if the main component of the plasticizer is dibutyl phthalate (molecular weight: 278), dioctyl phthalate (molecular weight: 391) or di-2-ethylhexyl adipate (molecular weight: 371), having a molecular weight of less than 413, it volatilizes from the substrate handling instrument at a normal temperature of a clean room (23° C.), and is adsorbed on a substrate. Therefore, it is not preferable.

In the present invention, it is preferable that the main component of the anti-oxidizing component should be a phenol-based compound having a molecular weight of 300 or higher. It is particularly preferable that the main component of the anti-oxidizing agent should be at least one of monophenol-based compounds such as stearyl-β-(3,5-di-t-butyl-4-hydroxyphenyl) propionate (molecular weight: 520.9); bisphenol-based compounds such as 2,2'-methylene-bis-(4-methyl-6-t-butylphenol) (molecular weight: 340.5), 2,2'-methylene-bis-(4-ethyl-6-t-butylphenol) (molecular weight: 368.5), 4,4'-thiobis-(3-methyl-6-t-butylphenol) (molecular weight: 358.5), 4,4'-butylidenbis-(3-methyl-6-t-butylphenol) (molecular weight: 382.6); and high-molecule phenol-based compounds such as 1,1,3-tris-(2-methyl-4-hydroxy-5-t-butylphenol)butane (molecular weight: 544.8), 1,3,5-trimethyl-2,4,6-tris(3,5-di-t-butyl-4-hydroxybenzyl) benzene (molecular weight: 775.2), tetrakis-[methylene-3-(3',5'-di-t-butyl-4'-hydroxyphenyl) propionate] methane (molecular weight: 1177.7), bis-[3,3'-bis-(4'-hydroxy-3'-t-butylphenyl) butylic acid] glycol ester (molecular weight: 794.4).

If the main component of the anti-oxidizing agent is 2,6-di-t-butyl-p-cresol (molecular weight: 220.4) or 2,6-di-t-butyl-4-ethylphenol (molecular weight: 234.2), which has a molecular weight of less than 300, it volatilizes from the substrate handling instrument at a normal temperature of a clean room (23° C.), and is adsorbed on a substrate. Therefore, it is not preferable.

In the present invention, it is preferable that the main component of the antistatic agent should be a nonionic-based compound having a molecular weight of 350 or higher. It is particularly preferable that the nonion-based compound should be at least one of polyoxyethylenealkylamine, polyoxyethylenealkylamide, polyoxyethylenealkylether, polyoxyethylenealkylphenylether, and N,N'-bis-(diethylene glycol) stearyl amine. In the main component of the antistatic agent, the molecular weight is calculated from the carbon atom number of the alkyl group and/or the number of bonding of polyoxyethylene.

If the main component of the anti-static agent is N,N'-bis-(2-hydroxyethyl) lauryl amide (molecular weight: 273), it volatilizes from the substrate handling instrument at a normal temperature of a clean room (23° C.), and is adsorbed on a substrate. Therefore, it is not preferable.

As described above, with use of the aforementioned compounds as the main components of the additives, that is, the lubricant, plasticizer, anti-oxidizing agent and anti-static agent, the volatilization of the component from the substrate handling instrument can be prevented, thus making it possible to prevent the contamination of the substrate. It should be noted that when the main component of at least one of the additives including lubricant, plasticizer, anti-oxidizing agent and anti-static agent is the above-listed compound, the contamination of the substrate can be reduced.

In the present invention, it is preferable that the resin base should be one selected from the group consisting of polyolefins such as polyethylene and polypropylene, and fluorine resins such as polycarbonate and tetrafluoroethylene-perfluoroalcoxyethylene copolymer (PFA).

Examples of the preferable materials used for the instruments of the present invention are those using polypropylene as the resin material, and containing as the additives, a lubricant having microcrystalline wax as the main component, a plasticizer having di-2-ethylhexyl sebacate as the main component, an anti-oxidizing agent having tetrakis-[methylene-3-(3',5'-di-t-butyl-4'-hydroxyphenyl) propionate] methane as the main component and, if necessary, an anti-static agent which is an ethylene oxide adduct having stearyl amide as the main component.

In the present invention, the instruments for handling substrates are formed of the above-described resin material and additives, by adding a predetermined amount of each additive to the resin base, followed by kneading with heat, and subjecting such a resin composition to injection molding.

Examples which were carried out to clarify the effect of the present invention will now be described.

EXAMPLE 1

To 100 parts by weight of polypropylene (average molecular weight: 100,000, a product of MITSUI TOATSU KAGAKU), 5 parts by weight of a lubricant (molecular weight: 420, NIHON SEKIYU), 3 parts by weight of a plasticizer (molecular weight 427; DAIHACHI KAGAKU KOGYO), 1 part by weight of an anti-oxidizing agent (molecular weight: 521, YOSHITOMI SEIYAKU KOGYO), 2 parts by weight of an anti-static agent (average molecular weight: 440, LION) were added, and they were kneaded while heating. With use of the material, injection molding was carried out to manufacture a wafer carrier having dimensions of 208 mm in vertical direction×236 mm in lateral direction×215 mm in height, and having a pitch between wafers of 6.35 mm. It should be noted that the main component of the lubricant was micro-crystalline wax, the main component of the plasticizer was di-2-ethylhexyl sebacate, the main component of the anti-oxidizing agent was stearyl-β(3,5-di-t-butyl-4-hydroxyphenyl) propionate, and the main component of the anti-static agent was N,N'-bis-(diethyleneglycol)stearylamine(stearyldiethyleneglycol amine).

A portion (40 g) was cut out from the thus obtained wafer carrier. With regard to the sample, organic materials of the additives which were adsorbed on a wafer were examined using Silicon Wafer Analyzer (tradename, to be abbreviated as "SWA" hereinafter, product of GL Science).

The SWA consists of roughly three devices, more specifically, a trap device for heat-desorbing adsorbed components from a wafer to which organic materials were adsorbed, in a helium gas stream, and re-trapping them, a thermal desorption cold trap injector (TCT) device for introducing the re-trapped organic components into a capillary tube which is cooled down with liquid nitrogen, while heat-desorbing the organic components, so as to trap them to be concentrated, and a gas chromatography/mass spectrum (GC/MS) for analyzing the cooled and concentrated components by rapidly heating them in a helium gas stream. By the GC/MS device, a total ion chromatogram (TIC) in which the organic components are separated by the GC device, can be obtained. For each of the peaks, the organic components are subjected to quantitative analysis by the MS device. With the SWA, it is possible to measure the contents and types of organic materials adsorbed to a wafer. Further, according to the SWA, the analysis can be carried out in an order of several ng($10^{-9}$g) per wafer.

The measurement of organic materials of the additives, which were adsorbed to a wafer, was carried out in the following manner. First, a portion of a wafer carrier and a 4-inch silicon wafer whose surface was washed, were placed in a common desiccator to be several centimeters away from each other. A cover is placed on the desiccator and let is stand for several hours (four example, 6 hours). The wafer to which organic materials were adsorbed was inserted to the SWA, where the adsorbed organic materials were desorbed by heating the wafer at 315° C. under a helium gas stream, and then trapped once by the trap device. Next, the trapped organic materials were heat-adsorbed in the helium gas stream, and then cooled down with liquid nitrogen in the TCT device to be concentrated. After that, the cooled and concentrated organic components were heated to 280° C. in a helium gas stream, and the organic components were introduced into the GC/MS device.

As the GC/MS device, G-3000/M-80B (tradenames, products of HITACHI) was used, under the measurement conditions that a range was set to be 40° C. to 280° C. (left for 40 minutes), and the temperature increasing rate was set to 10° C. per minute. The column used had specifications: 100% methylpolysiloxane, a length of 60 m, an inner diameter of 0.25 mm, and a film thickness of 0.25 μm. The ionizing method of the MS device was the electron impact method, and the detection range was set to be 0 to 600 in m/z. It should be noted that the quantitative analysis was carried out on the basis of the analytical curve formed with hexadecane and the concentration converted with regard to hexadecane.

As a result, it was 5 ng/wafer in hexadecane conversion. Further, the peaks of TIC were subjected to quantitative analysis; however the peaks were so minute (the adsorption of the organic material very much less) that the quantitative analysis was not possible. That is, the volatilization of the compounds of the additives from the wafer carrier which is a substrate handling instrument, is less, and therefore wafers are not contaminated.

Next, 5 test pieces of 45×45 mm were cut from the wafer carrier, and with use of these samples, the static property was examined by an electrostatic measurement device, Static Honest Meter (tradename, product of Shishido Static). The static property was evaluated by static voltage and half value period.

The electrostatic measurement device mainly consists of an application unit for charging a test piece arbitrarily, a turntable for inducing a corona discharge, a receiving unit for detecting a voltage of a test piece and an amplifier.

First, the half value period measurement device was connected to a synchroscope or a recording meter. The voltage applied was set to ±10 kV, the distance from the tip end of the needle electrode of the application unit to the surface of the turntable was 20 mm, and the distance from the electrode of the receiving unit to the turntable was set to 15 mm. In the case where a test piece is extremely thick, the distance from the tip end of the needle of the application unit to the surface of the test piece and the distance from the electrode plate of the receiving unit thereto, should be set to 20 mm or 15 mm. Such conditions are added to the results.

Next, the test piece was discharged by means of a discharger, and then the test piece was mounted to a mount frame such that the surface thereof faces upwards. As the turntable was rotated, the application of a voltage of +10 kv was carried out for 30 seconds, and after that, the application of the voltage was stopped. Then, while the rotation of the turntable was maintained, the time required for which the charge voltage decays to ½ of the initial charge voltage was measured. It should be noted that in the case where it takes 120 seconds or more for the initial charge voltage to attenuate to negative, the measurement was stopped at 120 seconds. For the rest of the four pieces, the measurement was carried out in the same manner. The result indicated that the charge property was 0 V, and therefore the half value period was not observed.

EXAMPLE 2

A wafer carrier was manufactured in the same manner as in Example 1, except that natural paraffin (having a carbon atom number of 22 or more) was used as the main component of the lubricant, 2,2'-methylene-bis-(4-methyl-6-t-butylphenol) was used as the main component of the anti-oxidizing agent, and N,N'-bis-(diethyleneglycol) stearyl amine was used as the main component of the anti-static agent.

The wafer carrier was examined in terms of the organic material adsorption amount and charge property of a wafer, as in the case of Example 1. As a result, the adsorption amount of wafer was as very small as 7 ng. Further, the peaks of the TIC were subjected to the quantitative analysis; however the peaks were so minute (the adsorption of organic material is very small) that the quantitative analysis was not possible. Further, the charge voltage was 0 V, and therefore the half value period was not observed.

EXAMPLE 3

A wafer carrier was manufactured in the same manner as in Example 1, except that synthetic paraffin (having a carbon atom number of 24 or more) was used as the main component of the lubricant, di-isodecyl trimellitate was used as the main component of the plasticizer, 1,1,3-tris-(2-methyl-4-hydroxy-5-t-butylphenol) butane was used as the main component of the anti-oxidizing agent, and N,N'-bis-(diethyleneglycol) stearyl amine was used as the main component of the anti-static agent.

The wafer carrier was examined in terms of the organic material adsorption amount and charge property of a wafer, as in the case of Example 1. As a result, the adsorption amount of wafer was as very small as 3 ng. Further, the peaks of the TIC were subjected to the quantitative analysis; however the peaks were so minute (the adsorption of organic material is very small) that the quantitative analysis was not possible. Further, the charge voltage was measured by a rotary static tester, and it was 0v; therefore the half value period was not observed.

Comparative Example 1

A wafer carrier of Fluoroware Co. was prepared. The wafer carrier was examined in terms of the organic material adsorption amount and charge property of a wafer, as in the case of Example 1. As a result, the adsorption amount of wafer was as very large as 173 ng. Further, the peaks of the TIC of this case by the GC/MS method were subjected to the quantitative analysis, and in the analysis, aliphatic hydrocarbons each having a carbon atom number of up to 18, higher alcohols having a carbon atom number of up to 16, aliphatic aldehydes having a carbon atom number of up to 12, 2,6-bis-(1,1-dimethylethyl)-4-methylphenol and oxide products, dioctyl adipate, and dioctyl phthalate, were observed.

Further, the charge voltage was 1560 V, and the half value period was 120 seconds or longer.

Comparative Example 2

To 100 parts by weight of polypropylene (a product of MITSUI TOATSU KAGAKU), 3 parts by weight of a lubricant (NIHON SEKIYU), 3 parts by weight of a plasticizer (DAIHACHI KAGAKU KOGYO), 2 parts by weight of an anti-oxidizing agent (YOSHITOMI SEIYAKU KOGYO), 1.5 parts by weight of an anti-static agent (LION) were added, and they were kneaded while heating. With use of the material, injection molding was carried out to manufacture a wafer carrier having dimensions of 208 mm in vertical direction×236 mm in lateral direction×215 mm in height, and having a pitch between wafers of 6.35 mm. It should be noted that the main component of the lubricant was fluidic paraffins (having a carbon atom number of 12 to 18), the main component of the plasticizer was di-octyl phthalate (molecular weight: 391), the main component of the anti-oxidizing agent was 2,6-bis-t-butyl-p-cresol (molecular weight: 220), and the main component of the anti-static agent was N,N'-bis-(2-hydroxyethyl) laurylamide (molecular weight:270). The wafer carrier was examined in terms of the organic material adsorption amount and charge property of a wafer, as in the case of Example 1. As a result, the adsorption amount of wafer was as very large as 216 ng.

Further, the peaks of the TIC of this case by the GC/MS method were subjected to the quantitative analysis, and in the analysis, aliphatic hydrocarbons each having a carbon atom number of 12 to 18, di-octyl phthalate, 2,6-di-t-butyl-p-cresol, and N,N'-bis(2-hydroxyethyl) laurylamide and the like, were observed.

Further, the charge voltage was 0 V, and the half value period was not observed.

The above examples were described in connection with the case where the present invention was applied to the instruments for handling silicon wafers and the wearable articles; however the present invention is not limited to these examples, but can be applied to the case for other substrates such as LCD glass substrate and exposure mask.

Figure 3A:
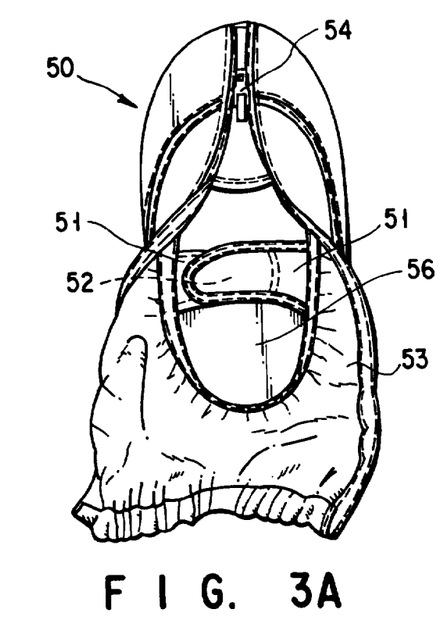
FIGS. 3A and 3B are plan views showing a shoe for clean room.
Figure 3B:
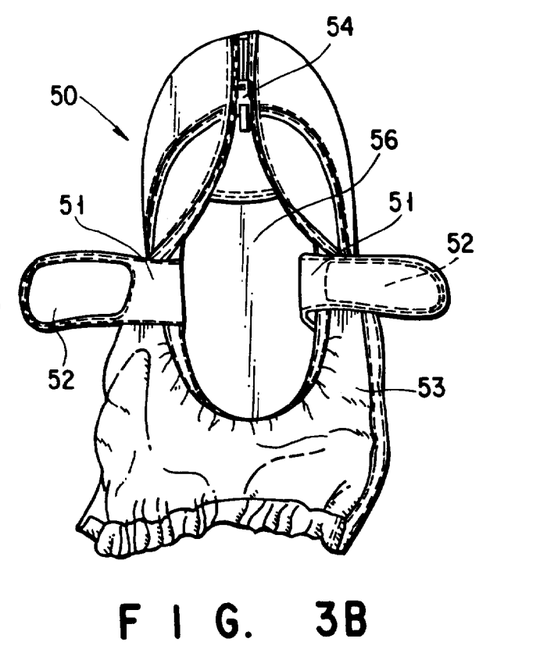
Figure 4:
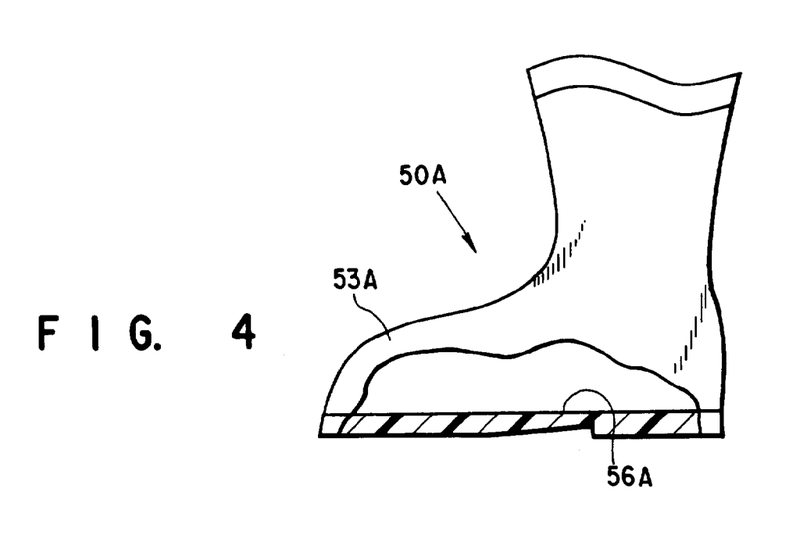
FIG. 4 is a side view of another shoe for clean room.

Next, a shoe for a clean room, as an example of the wearable articles, will now be described with reference to FIGS. 3A and 3B and FIG. 4.

A shoe for clean room is disclosed in Jpn. Pat. Appln. KOKAI Publication No. 7-297257. As shown in FIGS. 3A and 3B, a shoe 50 for a clean room includes a pair of flexible tab members 51, velcro fasteners 52, a flexible cover 53, an ordinary fastener 54 and a sole 56. The velcro fasteners 52 are adhered, one to the front surface of one of the tab members 51 and the other to the rear surface of the other tab member 51. The ordinary fastener 54 is sewn to matching edges of the flexible cover 53. The fasteners 53 and 54 are designed to fasten up or open the flexible cover 53.

Further, the sole 56 is adhered or stitched to the other edge of the flexible cover 53. The sole 56 is made of an urethane resin, and a material containing at least one of the group consisting of additives such as a sponging agent for sponging the urethane resin, a silicon-based sponging controlling agent which does not substantially generate siloxane of low molecular, a plasticizer, an anti-oxidizing agent, an anti-static agent and a UV ray absorbing agent. It should be noted that as shown in FIG. 4, there is another type of shoe 50A, in which a flexible cover 53A without a zip fastener is fixed onto a sole 56A.

In the case where the sole 56 of a clean room shoe is manufactured using the above-described resin base and additives, a predetermined amount of additive is added to a resin material, and kneaded while heating.

Then, the resin composition is subjected to injection molding.

In the present invention, it is preferable that the main component of the plasticizer should be one of a carboxylate having a molecular weight of 400 or more, a polyester having a molecular weight of 400 or more, and an epoxy-based compound having a molecular weight of 400 or more. It is particularly preferable that the main component of the plasticizer should be at least one of phthalic acid ester-based compounds such as isononyl phthalate (molecular weight: 418), octadecyl phthalate (molecular weight: 419), isodecyl phthalate (molecular weight: 447), and lauryl phthalate (molecular weight: 502); aliphatic dibasic acid ester-based compounds such as di-2-ethylhexyl azelate (molecular weight: 413) and di-2-ethylhexyl sebacate (molecular weight: 427); trimellitate ester-based compounds such as tris-2-ethylhexyl trimellitate (molecular weight: 547) and trioctyl trimellitate (molecular weight: 547); polyester-based compounds which are polymers obtained by reactions between dibasic acids such as adipic acid, azelaic acid, sebacic acid and phthalic acid, and glycol or glycerin, especially, propylene glycol adipate-based compounds or butylene glycol adipate-based compounds each having a molecular weight of 2000 to 8000; and epoxy-based compounds such as epoxy fatty ester-based compounds (molecular weight: 400 to 500) and epoxy oil (molecular weight: about 1000).

It should be noted that if the main component of the plasticizer is dibutyl phthalate (molecular weight: 278), dioctyl phthalate (molecular weight: 391) or di-2-ethylhexyl adipate (molecular weight: 371), having a molecular weight of less than 400, it volatilizes from the sole of the shoe at a normal temperature of a clean room (23° C.), and is adsorbed on a wafer. Therefore, it is not preferable.

In the present invention, it is preferable that the main component of the anti-oxidizing component should be a phenol-based compound having a molecular weight of 300 or higher. It is particularly preferable that the main component of the anti-oxidizing agent should be at least one of monophenol-based compounds such as stearyl-β-(3,5-di-t-butyl-4-hydroxyphenyl) propionate (molecular weight: 520.9); bisphenol-based compounds such as 2,2'-methylene-bis-(4-methyl-6-t-butylphenol) (molecular weight: 340.5), 2,2'-methylene-bis-(4-ethyl-6-t-butylphenol) (molecular weight: 368.5), 4,4'-thiobis-(3-methyl-6-t-butylphenol) (molecular weight: 358.5), 4,4'-butylidenbis-(3-methyl-6-t-butylphenol) (molecular weight: 382.6); and high-molecule phenol-based compounds such as 1,1,3-tris-(2-methyl-4-hydroxy-5-t-butylphenol)butane (molecular weight: 544.8), 1,3,5-trimethyl-2,4,6-tris(3,5-di-t-butyl-4-hydroxybenzyl) benzene (molecular weight: 775.2), tetrakis-[methylene-3-(3',5'-di-t-butyl-4'-hydroxyphenyl) propionate] methane (molecular weight: 1177.7), bis-[3,3'-bis-(4'-hydroxy-3'-t-butylphenyl) butylic acid] glycol ester (molecular weight: 794.4).

If the main component of the anti-oxidizing agent is 2,6-di-t-butyl-p-cresol (molecular weight: 220.4) or 2,6-di-t-butyl-4-ethylphenol (molecular weight: 234.2), which has a molecular weight of less than 300, it volatilizes from the sole of the ordinary clean room at a normal temperature of a clean room (23° C.), and is adsorbed on a wafer. Therefore, it is not preferable.

In the present invention, it is preferable that the main component of the antistatic agent should be a nonion-based compound having a molecular weight of 350 or higher. It is particularly preferable that the nonion-based agent should be at least one of polyoxyethylenealkylamine, polyoxyethylenealkylamide, polyoxyethylenealkylether, polyoxyethylenealkylphenylether, and N,N'-bis-(diethylene glycol) stearyl amine. In the main component of the anti-static agent, the molecular weight is calculated from the carbon atom number of the alkyl group and/or the number of bonding of polyoxyethylene.

If the main component of the anti-static agent is N,N'-bis-(2-hydroxyethyl) lauryl amide (molecular weight: 273), it volatilizes from the sole of the clean room shoe at a normal temperature of a clean room (23° C.), and is adsorbed on a wafer. Therefore, it is not preferable.

In the present invention, it is preferable that the main component of the ultraviolet ray absorbing agent should be a compound having a molecular weight of 300 or more. It is preferable that the main component of the ultraviolet absorbing agent should be one of a salicylate-based compound such as p-octylphenylsalicylate (molecular weight: 326), benzophenone-based compounds such as 2-hydroxy-4-octoxybenzophenone (molecular weight: 326), 2-hydroxy-4-dodecyloxybenzophenone (molecular weight: 382); and benzotriazol-based compounds such as 2-(2'-hydroxy-3'-t-butyl-5'-methylphenyl)-5-clorobenzotriazol (molecular weight: 315), 2-(2'-hydroxy-3',5'-di-t-butylphenyl)-5-chlorobenzotriazol (molecular weight: 361), 2-(2'-hydroxy-3',5'-di-t-amylphenyl)benzotriazol (molecular weight: 334), 2-(2'-hydroxy-3'(3",6",5",6"-tetrahydrophthalimidemethyl)-5-methylphenyl)benzotriazol (molecular weight: 388), and the like. It should be noted that the ultraviolet absorbing agent may not be used in the case where a resin material having an excellent weathering resistance, such as polyvinyl chloride, is used.

In the present invention, it is preferable that the resin material should be polyvinyl chloride resin or urethane resin. These resins are preferable because each has a flexibility and a resiliency, which are necessary for the shoe sole, and further has a less out gas amount of organic materials of each resin.

Further, the present invention provides a clean room shoe having a sole made of an urethane resin and a material containing at least one of the group consisting of additives such as, a sponging agent for sponging the urethane resin, a silicon-based sponging controlling agent which does not substantially generate siloxane of low molecular, a plasticizer, an anti-oxidizing agent, an anti-static agent and a UV ray absorbing agent, which is characterized in that the additives do not generate gaseous organic material.

In this case, it is preferable that the silicon-based sponging controlling agent should be at least one of dimethylpolysiloxane which does not substantially contain cyclic siloxane having a silicon atom number of 10 or less and dimethylpolysiloxane-polyocyalkylene copolymer. Such compounds can be obtained by eliminating cyclic siloxanes having a silicon atom number of 10 less by heating a commercially available silicon-based sponge controlling agent while vacuum-deareating it.

Preferable examples of the material for the clean room shoe of the present invention are those containing polyvinyl chloride, vinyl chloride-based elastomer and chlorinated polyethylene resin as a resin base, a plasticizer whose main component is tris-2-ethylhexyl trimellitate, an anti-oxidizing agent whose main component is 2,2'-methylene-bis-(4-ethyl-6-t-butylphenol) and an antistatic agent whose main component is an ethyleneoxide adduct of stearylamide, and those using a urethane resin as a resin material, and containing additives a plasticizer whose main component is di-2-ethylhexyl sebacate, an anti-oxidizing agent whose main component is 2,2'-methylene-bis-(4-ethyl-6-t-butylphenol), an antistatic agent whose main component is a polyethyleneglycol-p-nonylphenol, and an ultraviolet ray absorbing agent whose main component is 2-(2'hydroxy-3',5'-di-t-amylphenol) benzotriazol. It should be noted that when sponging the urethane resin, it is preferable that dimethylpolysiloxane-polyoxyalkilene co-polymer which was treated at a degree of vacuum of 10 mmHg at 150° C. for 3 hours should be used together with a sponging agent.

Next, an example which was carried out so as to clarify the effect of the present invention will now be described.

EXAMPLE 4

To 100 parts by weight of pre-polymer for polyurethane and a hardener (having an average molecular weight of 4000; a product of MITSUI TOATSU KAGAKU), 5 parts by weight of a plasticizer (having a molecular weight of 427; DAIHACHI KAGAKU KOGYO), 0.5 parts by weight of an anti-oxidizing agent (having a molecular weight of 340; YOSHITOMI SEIYAKU KOGYO), 1 part by weight of an anti-static agent (having an average molecular weight of 450; LION), and 0.5 parts by weight of an ultraviolet ray absorbing agent (having a molecular weight of 334; CHIBA GAIGI CO.) were added, and they were kneaded while heating. Further, to this material, water serving as a sponging agent was added, and dimethylpolysiloxane-polyoxyalkylene co-polymer (having an average molecular weight of 1800; SHINETU KAGAKU KOUGYOU) was further added as a sponging agent. It should be noted that dimethylpolysiloxane-polyoxyalkylene co-polymer used here was treated at a degree of vacuum of 10 mmHg at 150° C. for 3 hours. With use of this material, the injection molding was carried out, and thus a flat plate having dimensions of 100×100 mm and a thickness of 10 mm was obtained.

In this case, the main component of the plasticizer was di-2-ethylhexyl sebacate, the main component of the anti-oxidizing agent was 2,2'-methylene-bis-(4-ethyl-6-t-butylphenol), the main component of the antistatic agent was polyethyleneglycol-p-nonylphenyl ether, and the main component of the ultraviolet ray absorbing agent was 2-(2-hydroxy-3',5'-di-t-amylphenol) benzotriazol.

A portion (40 g) was cut out from the thus obtained wafer carrier. With regard to the sample, organic materials of the additives which were adsorbed on a wafer were examined using Silicon Wafer Analyzer (tradename, to be abbreviated as "SWA" hereinafter, product of GL Science).

The SWA consists of roughly three devices, more specifically, a trap device for heat-desorbing adsorbed components from a wafer to which organic materials were adsorbed, in a helium gas stream, and re-trapping them, a thermal desorption cold trap injector (TCT) device for introducing the re-trapped organic components into a capillary tube which is cooled down with liquid nitrogen, while heat-desorbing the organic components, so as to trap them to be concentrated, and a gas chromatography/mass spectrum (GC/MS) for analyzing the cooled and concentrated components by rapidly heating them in a helium gas stream. By the GC/MS device, a total ion chromatogram (TIC) in which the organic components are separated by the GC device, can be obtained. For each of the peaks, the organic components are subjected to quantitative analysis by the MS device. With the SWA, it is possible to measure the contents and types of organic materials adsorbed to a wafer. Further, according to the SWA, the analysis can be carried out in an order of several ng($10^{-9}$g) per wafer.

The measurement of organic materials of the additives, which were adsorbed to a wafer, was carried out in the following manner. First, a portion of a wafer carrier and a 4-inch silicon wafer whose surface was washed, were placed in a desiccator to be several centimeters away from each other. A cover is placed on the desiccator and let is stand for several hours (for example, 6 hours). The wafer to which organic materials as out-gas were adsorbed was inserted to the SWA, where the adsorbed organic materials were desorbed by heating the wafer at 315° C. under a helium gas stream, and then trapped once by the trap device. Next, the trapped organic materials were heat-adsorbed in the helium gas stream, and then cooled down with liquid nitrogen in the TCT device to be concentrated. After that, the cooled and concentrated organic components were heated to 280° C. in a helium gas stream, and the organic components were introduced into the GC/MS device.

As the GC/MS device, G-3000/M-80B (tradenames, products of HITACHI) was used, under the measurement conditions that a range was set to be 40° C. to 280° C. (left for 40 minutes), and the temperature increasing rate was set to 10° C. per minute. The column used had specifications: 100% methylpolysiloxane, a length of 60 m, an inner diameter of 0.25 mm, and a film thickness of 0.25 μm. The ionizing method of the MS device was the electron impact method, and the detection range was set to be 0 to 600 in m/z. It should be noted that the quantitative analysis was carried out on the basis of the analytical curve formed with hexadecane and the concentration converted with regard to hexadecane.

As a result, it was 5 ng/wafer in hexadecane conversion. Further, the peaks of TIC were subjected to quantitative analysis; however the peaks were so minute (the adsorption of the organic material very much less) that the quantitative analysis was not possible. That is, the volatilization of the compounds of the additives from the wafer carrier which is a substrate handling instrument, is less. In this embodiment, the evaluation was made not in the form of sole, but in the form of a flat plate, so as to facilitate the analysis. Further, separately it was confirmed that the material used here could be formed into a shape of a sole without problem.

Next, 5 test pieces of 45×45 mm were cut from the wafer carrier, and with use of these samples, the static property was examined by an electrostatic measurement device, Static Honest Meter (tradename, product of Shishido Static). The static property was evaluated by static voltage and half value period.

The electrostatic measurement device mainly consists of an application unit for charging a test piece arbitrarily, a turntable for inducing a corona discharge, a receiving unit for detecting a voltage of a test piece and an amplifier.

First, the half value period measurement device was connected to a synchroscope or a recording meter. The voltage applied was set to ±10 kV, the distance from the tip end of the needle electrode of the application unit to the surface of the turntable was 20 mm, and the distance from the electrode of the receiving unit to the turntable was set to 15 mm. In the case where a test piece is extremely thick, the distance from the tip end of the needle of the application unit to the surface of the test piece and the distance from the electrode plate of the receiving unit thereto, should be set to 20 mm or 15 mm. Such conditions are added to the results.

Next, the test piece was discharged by means of a discharger, and then the test piece was mounted to a mount frame such that the surface thereof faces upwards. As the turntable was rotated, the application of a voltage of +10 kv was carried out for 30 seconds, and after that, the application of the voltage was stopped. Then, while the rotation of the turntable was maintained, the time required for which the charge voltage decays to ½ of the initial charge voltage was measured. It should be noted that in the case where it takes 120 seconds or more for the initial charge voltage to attenuate to negative, the measurement was stopped at 120 seconds. For the rest of the four pieces, the measurement was carried out in the same manner. The result indicated that the charge property was 0 V, and therefore the half value period was not observed.

EXAMPLE 5

A flat plate was manufactured in the same manner as in Example 4, except that adipic acid-1,3-butyleneglycol was used as the main component of the plasticizer, 4,4'-butylene-bis-(3-methyl-6-t-butylphenol) was used as the main component of the anti-oxidizing agent, N,N'-bis-(diethyleneglycol) stearylamide was used as the main component of the antistatic agent, and 2-(2'-hydroxy-3',5'-di-t-amylphenyl)-5-chlorobenzotriazol was used as the main component of the ultraviolet ray absorbing agent.

The flat plate was examined in terms of the organic material adsorption amount and charge property of a wafer, as in the case of Example 4. As a result, the adsorption amount of wafer was as very small as 14 ng. Further, the peaks of the TIC were subjected to the quantitative analysis; however the peaks were so minute (the adsorption of organic material is very small) that the quantitative analysis was not possible. Further, the charge voltage was 0 V, and therefore the half value period was not observed.

EXAMPLE 6

To 100 parts by weight of polyvinyl chloride resin (having an average molecular weight of 20,000; a product of MITSUI TOATSU KAGAKU), 25 parts by weight of diisodecyl phthalate as a plasticizer, 1 part by weight of 2,2'-methylene-bis-(4-methyl-6-t-butylphenyl) as an anti-oxidizing agent, and 1 part by weight of N,N'-bis-(diethyleneglycol) stearylamine were added, and they were kneaded while heating. With use of this material, the injection molding was carried out and thus a flat plate was manufactured. In this case, an ultraviolet absorbing agent, a sponging agent or a sponging controlling agent was not added.

The flat plate was examined in terms of the organic material adsorption amount and charge property of a wafer, as in the case of Example 4. As a result, the adsorption amount of wafer was as very small as 20 ng. Further, the peaks of the TIC were subjected to the quantitative analysis; however the peaks were so minute (the adsorption of organic material is very small) that the quantitative analysis was not possible. Further, the charge voltage was 0 V, and therefore the half value period was not observed.

EXAMPLE 7

To 100 parts by weight of polyvinyl chloride resin, 7 parts by weight of adipic acid-1,3-butyleneglycol and 10 parts by weight of trioctyl trimellitate were added as a plasticizer, 1 part by weight of 1,1,3-tris-(2-methyl-4-hydroxy-5-t-butylphenyl) butane was added as an anti-oxidizing agent, and 2 part by weight of glycerin fatty ester was added as an antistatic agent, and they were kneaded while heating. With use of this material, the injection molding was carried out and thus a flat plate was manufactured. In this case, an ultraviolet absorbing agent, a sponging agent or a sponging controlling agent was not added.

The flat plate was examined in terms of the organic material adsorption amount and charge property of a wafer, as in the case of Example 4. As a result, the adsorption amount of wafer was as very small as 16 ng. Further, the peaks of the TIC were subjected to the quantitative analysis; however the peaks were so minute (the adsorption of organic material is very small) that the quantitative analysis was not possible. Further, the charge voltage was 0 V, and therefore the half value period was not observed.

Comparative Example 3

To 100 parts by weight of pre-polymer for polyurethane and a hardener, 5 parts by weight of dioctyl phthalate as a plasticizer, 2 parts by weight of 2,6-di-t-butyl-p-cresol as an anti-oxidizing agent, 1.5 part by weight of N,N'-bis-(2-hydroxyethyl) laurylamine as an anti-static agent, and 0.5 parts by weight of 2, (2'-hydroxy-5'-methylphenyl) benzotriazol as an ultraviolet ray absorbing agent were added, and they were kneaded while heating. Further, to this material, water serving as a sponging agent was added, and dimethylpolysiloxane-polyoxyalkylene co-polymer (having an average molecular weight of 1800; SHINETU KAGAKU KOUGYOU) was further added as a sponging agent. It should be noted that commercially available dimethylpolysiloxane-polyoxyalkylene co-polymer was used as it was. With use of this material, the injection molding was carried out and thus a flat plate was manufactured.

The flat plate was examined in terms of the organic material adsorption amount and charge property of a wafer, as in the case of Example 4. As a result, the adsorption amount of wafer was as large as 285 ng. Further, the peaks of the TIC were subjected to the quantitative analysis, and dioctyl phthalate, 2,6-di-t-butyl-p-cresol, N,N'-bis-(2-hydroxyethyl) laurylamine, 2,(2'-hydroxy-5'-methylphenyl) benzotriazol, hexadecamethylcyclocatsiloxane, octadecamethylcyclonanosiloxane and the like were observed. Further, the charge voltage was 52 V, and therefore the half value period was 1.04 seconds or more.

Comparative Example 4

To 100 parts by weight of polyvinyl chloride resin, 3 parts by weight of dioctyl phthalate as a plasticizer, 2 parts by weight of 2,6-di-t-butyl-p-cresol as an anti-oxidizing agent, and 1.5 parts by weight of N,N'-bis-(2-hydroxyethyl) laurylamide as an antistatic agent were added, and they were kneaded while heating. With use of this material, the injection molding was carried out and thus a flat plate was manufactured. In this case, an ultraviolet absorbing agent, a sponging agent or a sponging controlling agent was not added.

The flat plate was examined in terms of the organic material adsorption amount and charge property of a wafer, as in the case of Example 4. As a result, the adsorption amount of wafer was as large as 300 ng. Further, the peaks of the TIC were subjected to the quantitative analysis, and dioctyl phthalate, 2,6-di-t-butyl-p-cresol, N,N'-bis-(2-hydroxyethyl) laurylamide, and the like were observed.

Industrial Applicability

With regard to the wafer carrier, SMIF POD, wafer box, wafer basket, wafer tray, wafer handling jig, which are the instruments of the present invention, the additives added to the resin base are of the types which do not generate a gaseous organic material, and therefore the amount of the organic material components adsorbed to a wafer can be reduced to about 1/5 of the conventional case.

With regard to the wafer carrier, SMIF POD, wafer box, wafer basket, wafer tray, wafer handling jig, which are the instruments of the present invention, the additives added to the resin base are of the types which do not generate a gaseous organic material, and therefore the amount of the organic material components adsorbed to a wafer can be reduced to about 1/5 of the conventional case.

Further, with regard to the shoe as a wearable article of the present invention, the additives added to the resin base which constitutes a sole are of the types which do not generate a gaseous organic material, and therefore the amount of the organic material components adsorbed to a wafer can be reduced to about 1/5 of the conventional case.

Thus, the contamination of wafers with organic materials can be prevented in the manufacture of a semiconductor device, and it becomes possible to improve the yield.

We claim:

1. An instrument used for handling a substrate in the manufacture of a semiconductor device in a clean room at room temperature under atmospheric pressure, comprising: a resin base, an anti-oxidizing agent added to the resin base and made of a phenol-based compound having a molecular weight of 300 or more, and an antistatic agent added to the resin base and made of a nonionic-based compound having a molecular weight of 350 or more, wherein both the anti-oxidizing agent and antistatic agent additives do not easily generate a gaseous organic material component from the resin base under conditions of room temperature and atmospheric pressure.

2. An instrument according to claim 1, wherein resin base includes a lubricant, and the lubricant contains as a main component at least one selected from the group consisting of aliphatic hydrocarbons having a carbon atom number of 20 or more and higher alcohols having a carbon atom number of 18 or more, and does not contain aliphatic hydrocarbons having a carbon atom number of less than 20 and higher alcohols having a carbon atom number of less than 18.

3. An instrument according to claim 2, wherein the lubricant is made of at least one selected from the group consisting of microcrystalline wax, natural paraffin, synthetic paraffin, polyolefin wax, synthetic branch higher alcohols having a carbon atom number of 18, synthetic branched higher alcohols having a carbon atom number of 20, synthetic branched higher alcohols having a carbon atom number of 24 and oleyl alcohol.

4. An instrument according to claim 1, wherein the resin base contains a plasticizer, and the plasticizer contains as a main component at least one selected from the group consisting of diisodecyl phthalate having a molecular weight of 447, and dilauryl phthalate having a molecular weight of 502, as carboxylic acid esters having a molecular weight of 420 or more, di-2-ethylhexyl azelate having a molecular weight of 413, di-2-ethylhexyl sebacate having a molecular weight of 427, tris-2-ethylhexyl trimellitate having a molecular weight of 547, trioctyl trimellitate having a molecular weight of 547, propyleneglycol adipate having a molecular weight of 2000 to 8000 as polyesters having a molecular weight of 400 or more, epoxy fatty acid ester-based compound having a molecular weight of 400 to 500 as epoxy-based compound having a molecular weight of 400 or more, and epoxydized oil having a molecular weight of 1000 or more, and does not contain carboxylic acid esters having a molecular weight of less than 413, polyesters having a molecular weight of less than 400, epoxy-based compounds having a molecular weight of less than 400, epoxy fatty acid ester-based compound having a molecular weight of less than 400 or epoxydized oil having a molecular weight of less than 1000.

5. An instrument according to claim 1, wherein the anti-oxidizing agent is made of at least one selected from the group consisting of monophenol-based compounds, bisphenol-based compounds and high-molecular phenol-based compounds.

6. An instrument according to claim 1, wherein the nonionic-based compound serving as the antistatic agent is made of at least one selected from the group consisting of polyoxyethylenealkylamine, polyoxyethylenealkylamide, polyoxyethylenealkylether, polyoxyethylenealkylphenylether and N,N'-bis-(dietheyleneglycol) stearylamine.

7. An instrument according to claim 1, wherein the instrument is a cassette, a SMIF POD, a wafer tray, a wafer box, a wafer basket or a wafer handling jig, which is used for handling a semiconductor wafer.

8. An instrument according to claim 1, wherein the resin base is made of one selected from the group consisting of a polyolefin, a polycarbonate and a fluorine resin.

9. A wearable article worn by an operator in a clean room at room temperature under atmospheric pressure comprising: a resin base and an anti-oxidizing agent added to the resin base and made of a phenol-based compound having a molecular weight of 300 or more, an antistatic agent added to the resin base and made of a nonionic-based compound having a molecular weight of 350 or more, and a plasticizer added to the resin base, wherein all of the anti-oxidizing agent, antistatic agent and the plasticizer do not easily generate a gaseous organic material component from the resin base under conditions of room temperature and atmospheric pressure.

10. A wearable article according to claim 9, wherein the plasticizer contains as a main component, at least one selected from the group consisting of diisodecyl phthalate having a molecular weight of 447 and dilauryl phthalate having a molecular weight of 502, di-2-ethylhexyl azelate having a molecular weight of 413, di-2-ethylhexyl sebacate having a molecular weight of 427 as carboxylic acid esters having a molecular weight of 420 or more, tris-2-ethylhexyl trimellitate having a molecular weight of 547, trioctyl trimellitate having a molecular weight of 547, propyleneglycol adipate having a molecular weight of 2000 to 8000 as polyesters having a molecular weight of 400 or more, epoxy fatty acid ester-based compound having a molecular weight of 400 to 500 as epoxy-based compound having a molecular weight of 400 or more, and epoxydized oil having a molecular weight of 1000 or more, and does not contain carboxylic acid esters having a molecular weight of less than 413, polyesters having a molecular weight of less than 400, epoxy-based compounds having a molecular weight of less than 400, epoxy fatty acid ester-based compound having a molecular weight of less than 400 or epoxydized oil having a molecular weight of less than 1000.

11. A wearable article according to claim 9, wherein the anti-oxidizing agent is made of at least one selected from the group consisting of monophenol-based compounds, bisphenol-based compounds and high-molecular phenol-based compounds.

12. A wearable article according to claim 9, wherein the nonionic-based compound serving as the antistatic agent is made of at least one selected from the group consisting of polyoxyethylenealkylamine, polyoxyethylenealkylamide, polyoxyethylenealkylether, polyoxyethylenealkylphenylether and N,N'-bis-(dietheyleneglycol) stearylamine.

13. A wearable article according to claim 9, further comprising an ultraviolet absorbing agent, and the ultraviolet absorbing agent is made of a compound having a molecular weight of 300 or more containing at least one selected from the group consisting of salicylic acid-based compounds and benzophenon-based compounds.

14. A wearable article according to claim 9, wherein the resin base is polyvinyl chloride, vinylchloride-based elastomer, chlorine-based polyethylene or urethane resin.

15. A wearable article according to claim 9, wherein the article is a shoe having a sole comprising a prepolymer for urethane resin and a hardener, and a material containing at least one of the additive group consisting of a sponging agent for sponging the urethane resin, a silicon-based sponging controlling agent subjected to a vacuum heat process such that the agent does not substantially generate low-molecular siloxane, a plasticizer, anti-oxidizing agent, an antistatic agent and an ultraviolet ray absorbing agent.

16. A wearable article according to claim 15, wherein the silicone-based sponging controlling agent is made of at least one selected from the group consisting of dimethylpolysiloxane which does not contain a cyclic siloxane having a silicon atom number of 10 or less, or dimethylpolysiloxane-polyoxyalkylene co-polymer.

17. A wearable article for use in a clean room, comprising: a sole made of a urethane resin and at least one of the additives selected for the group consisting of a sponging agent for sponging the urethane resin, a silicon-based sponging controlling agent subjected to vacuum heat process such that the agent does not substantially generate cyclic siloxane having a silicon atom number of 10 or less, a plasticizer, an anti-oxidizing agent, an antistatic agent and an ultraviolet ray absorbing agent; and a flexible cover adhered or stitched to the sole.

18. A wearable article according to claim 9, further comprising a fastener member for opening or closing the flexible cover.

19. A shoe to be worn by an operator in a clean room at room temperature and under atmospheric pressure, comprising a sole having a resin base, and admixed with the resin base, at least one additive selected from the group consisting of a lubricant, a plasticizer, an anti-oxidizing agent, an antistatic agent and an ultraviolet ray absorbing agent, wherein the lubricant contains as a main component a compound made of at least one selected from the group consisting of microcrystalline wax, natural paraffin, synthetic paraffin, polyolefin wax, synthetic branched higher alcohols having a carbon atom number of 18 or more, synthetic branched higher alcohols having a carbon atom number of 20 or more, synthetic branched higher alcohols having a carbon atom number of 24 or more and oleyl alcohol, and not containing aliphatic hydrocarbons having a carbon atom number of less than 20 or higher alcohols having a carbon atom number of less than 18, the plasticizer is made of a compound which contains as a main component one selected from the group consisting of diisodecyl phthalate having a molecular weight of 447, dilauryl phthalate having a molecular weight of 502, di-2-ethylhexyl azelate having a molecular weight of 413, di-2-ethylhexyl sebacate having a molecular weight of 427, as carbolic acid diesters having a molecular weight of 420 or more, tris-2-ethylhexyl trimellitate having a molecular weight of 547, trioctyl trimellitate having a molecular weight of 547, propyleneglycol adipate having a molecular weight of 2000 to 8000 as polyesters having a molecular weight of 400 or more, epoxy fatty acid ester-based compound having a molecular weight of 400 to 500 as epoxy-based compound having a molecular weight of 400 or more, and epoxydized oil having a molecular weight of 1000 or more, and does not contain carboxylic acid esters having a molecular weight of less than 413, polyesters having a molecular weight of less than 400, epoxy-based compounds having a molecular weight of less than 400, epoxy fatty acid ester-based compound having a molecular weight of less than 400 or epoxydized oil having a molecular weight of less than 1000, the anti-oxidizing agent is made of a phenol-based compound having a molecular weight of 300 or more, the antistatic agent is made of a nonionic-based compound having a molecular weight of 350 or more containing at least one selected from the group consisting of polyoxyethylenealkylamine, polyoxyethylenealkylamide, polyoxyethylenealkylether, polyoxyethylenealkylphenylether and N,N'-bis-(diethyleneglycol) stearylamine, and the ultraviolet ray absorbing agent is made of a compound having a molecular weight of 300 or more, selected from the group consisting of salicylic acid-based compounds and benzophenon-based compounds, wherein the additives do not easily release a gaseous organic material component from the resin base at room temperature and under atmospheric pressure.

20. A shoe according to claim 19, wherein the anti-oxidizing agent is made of at least one selected from the group consisting of monophenol-based compounds, bisphenol-based compounds and high-molecular phenol-based compounds.

21. A wearable article according to claim 17, further comprising a lubricant, the lubricant containing as a main component a compound made of at least one selected from the group consisting of microcrystalline wax, natural paraffin, synthetic paraffin and polyolefin wax, but not containing alcohols.

22. An instrument according to claim 7, comprising also a lubricant, and a plasticizer, as additional additives, wherein the lubricant contains as a main component a compound made of at least one selected from the group consisting of microcrystalline wax, natural paraffin, synthetic paraffin, polyolefin wax, synthetic branched higher alcohols having a carbon atom number of 18 or more, synthetic branched higher alcohols having a carbon atom number of 20 or more, synthetic branched higher alcohols having a carbon atom number of 24 or more and oleyl alcohol, and not containing aliphatic hydrocarbons having a carbon atom number of less than 20 or higher alcohols having a carbon atom number of less than 18, the plasticizer is made of a compound which contains as a main component one selected from the group consisting of diisodecyl phthalate having a molecular weight of 447, dilauryl phthalate having a molecular weight of 502, di-2-ethylhexyl azelate having a molecular weight of 413, di-2-ethylhexyl sebacate having a molecular weight of 427, tris-2-ethylhexyl trimellitate having a molecular weight of 547, trioctyl trimellitate having a molecular weight of 547, propyleneglycol adipate having a molecular weight of 2000 to 8000 as polyesters having a molecular weight of 400 or more, epoxy fatty acid ester-based compound having a molecular weight of 400 to 500 as epoxy-based compound having a molecular weight of 400 or more, and epoxydized oil having a molecular weight of 1000 or more, and does not contain carboxylic acid esters having a molecular weight of less than 413, polyesters having a molecular weight of less than 400, epoxy-based compounds having a molecular weight of less than 400, epoxy fatty acid ester-based compound having a molecular weight of less than 400 or epoxydized oil having a molecular weight of less than 1000, the antistatic agent is made of a nonionic-based compound having a molecular weight of 350 or more containing at least one compound selected from the group consisting of polyoxyethylenealkylamine, polyoxyethylenealkylamide, polyoxyethylenealkylether, polyoxyethylenealkylphenylether and N,N'-bis-(dietheyleneglycol) stearylamine, and wherein the additional additives also do not easily release a gaseous organic material component from the resin base at room temperature and under atmospheric pressure, all additives having a higher boiling point than 2,6-di-t-butyl-p-cresol and wherein the resin base is made of one selected from the group consisting of a polyolefin, a polycarbonate and a fluorine resin.

23. A shoe according to claim 20, wherein said lubricant, said plasticizer, said anti-oxidant, said antistatic agent, and said ultraviolet ray absorbing agent are all present admixed with the resin base and the resin base is a urethane resin.

* * * * *